US 12,471,359 B2

(12) United States Patent
Matsushita

(10) Patent No.: US 12,471,359 B2
(45) Date of Patent: Nov. 11, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kenichi Matsushita, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 465 days.

(21) Appl. No.: 17/901,890

(22) Filed: Sep. 2, 2022

(65) Prior Publication Data

US 2023/0307443 A1    Sep. 28, 2023

(30) Foreign Application Priority Data

Mar. 23, 2022   (JP) ................................. 2022-047228

(51) Int. Cl.
  *H10D 84/60*   (2025.01)
  *H10D 12/00*   (2025.01)
  (Continued)

(52) U.S. Cl.
  CPC ......... *H10D 84/617* (2025.01); *H10D 12/481* (2025.01); *H10D 62/107* (2025.01); *H10D 62/393* (2025.01)

(58) Field of Classification Search
  CPC .. H10D 84/617; H10D 12/481; H10D 62/107; H10D 62/393
  See application file for complete search history.

(56) References Cited

U.S. PATENT DOCUMENTS

2011/0042714 A1*  2/2011  Ogura ................. H10D 62/127
                                              257/E27.053
2012/0132955 A1*  5/2012  Saito .................... H10D 62/142
                                              257/140
(Continued)

FOREIGN PATENT DOCUMENTS

JP    2010-135677 A    6/2010
JP    2012-160601 A    8/2012
(Continued)

OTHER PUBLICATIONS

Office Action issued in Japanese Patent Application No. 2022-047228 dated Mar. 27, 2025, in 10 pages.

*Primary Examiner* — Jay C Kim
*Assistant Examiner* — Woo K Lee
(74) *Attorney, Agent, or Firm* — Knobbe, Martens, Olson & Bear, LLP

(57) ABSTRACT

A semiconductor device includes a first electrode, a first semiconductor region, a second semiconductor region, a third semiconductor region, a second electrode, a conductive part, and a fourth semiconductor region. The first semiconductor region is located above the first electrode. The second semiconductor region is located on the first semiconductor region. The third semiconductor region is located on the second semiconductor region. The second electrode is located on the second and third semiconductor regions. The second electrode is electrically connected with the second and third semiconductor regions. The conductive part includes a first conductive region and a second conductive region. The first conductive region faces the first to third semiconductor regions via an insulating film. The second conductive region is located around the second electrode. The fourth semiconductor region is located around the second semiconductor region. The fourth semiconductor (Continued)

region is electrically connected with the second semiconductor region.

20 Claims, 10 Drawing Sheets

(51) Int. Cl.
    *H10D 62/10*     (2025.01)
    *H10D 62/17*     (2025.01)

(56) References Cited

U.S. PATENT DOCUMENTS

| | | |
|---|---|---|
| 2019/0252374 A1* | 8/2019 | Kanetake ............ H10D 84/617 |
| 2019/0319026 A1 | 10/2019 | Yoshida |
| 2021/0280671 A1 | 9/2021 | Matsushita |
| 2021/0384330 A1 | 12/2021 | Yoshikawa et al. |

FOREIGN PATENT DOCUMENTS

| | | | |
|---|---|---|---|
| JP | 2016-009728 A | 1/2016 |
| JP | 2019-186504 A | 10/2019 |
| JP | 2021-141162 A | 9/2021 |
| WO | 2021/049499 A1 | 3/2021 |

\* cited by examiner

SEMICONDUCTOR DEVICE

CROSS-REFERENCE TO RELATED APPLICATIONS

This application is based upon and claims the benefit of priority from Japanese Patent Application No. 2022-047228, filed on Mar. 23, 2022; the entire contents of which are incorporated herein by reference.

FIELD

Embodiments relate to a semiconductor device.

BACKGROUND

A semiconductor device includes a cell region and a termination region outside the cell region; and the cell region includes an element such as, for example, an IGBT (Insulated Gate Bipolar Transistor), a MOSFET (Metal-Oxide-Semiconductor Field-Effect Transistor), a diode, etc. From the perspective of the breakdown voltage and the like, the termination region may include a semiconductor region electrically connected with a portion of the element described above.

DETAILED DESCRIPTION

Figure 1:
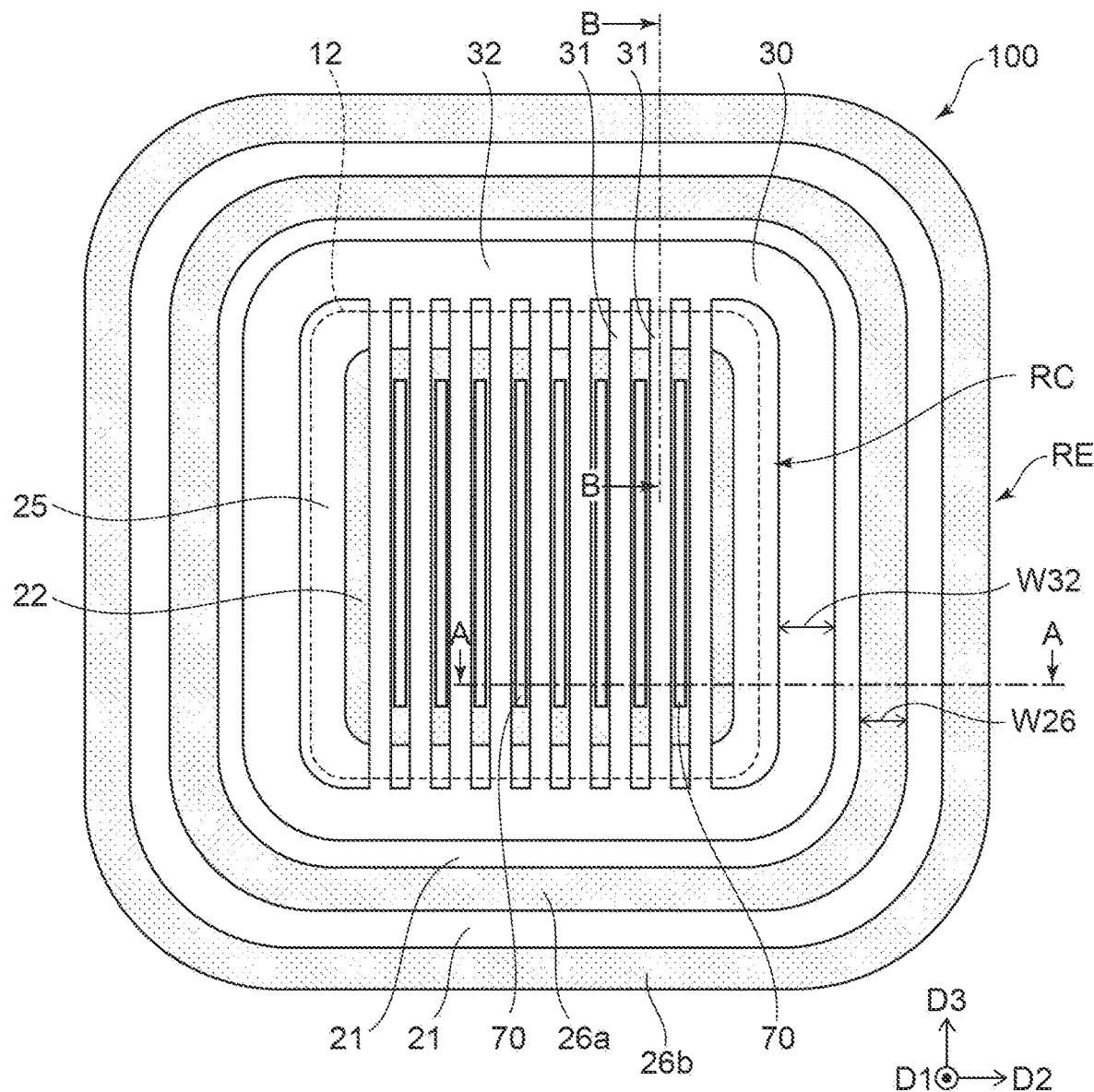
FIG. 1 is a schematic plan view illustrating a semiconductor device according to an embodiment.

A semiconductor device according to one embodiment, includes a first electrode, a first semiconductor region, a second semiconductor region, a third semiconductor region, a second electrode, a conductive part, and a fourth semiconductor region. The first semiconductor region is located above the first electrode. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The second electrode is located on the second and third semiconductor regions. The second electrode is electrically connected with the second and third semiconductor regions. The conductive part includes a first conductive region and a second conductive region. The first conductive region faces the first to third semiconductor regions via an insulating film. The second conductive region is located around the second electrode. The fourth semiconductor region is located around the second semiconductor region. The fourth semiconductor region is electrically connected with the second semiconductor region. The fourth semiconductor region is of the second conductivity type. The fourth semiconductor region includes an end portion in a direction perpendicular to a first direction. The first direction is from the first electrode toward the second electrode. The end portion contacting the first semiconductor region. At least a portion of the end portion is positioned further toward the first electrode side than the second conductive region in a direction along the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the embodiments described below, each embodiment may be implemented by inverting the p-type (an example of the second conductivity type) and the n-type (an example of the first conductivity type) of each semiconductor region.

FIG. 1 is a schematic plan view illustrating a semiconductor device according to an embodiment.

Figure 2:
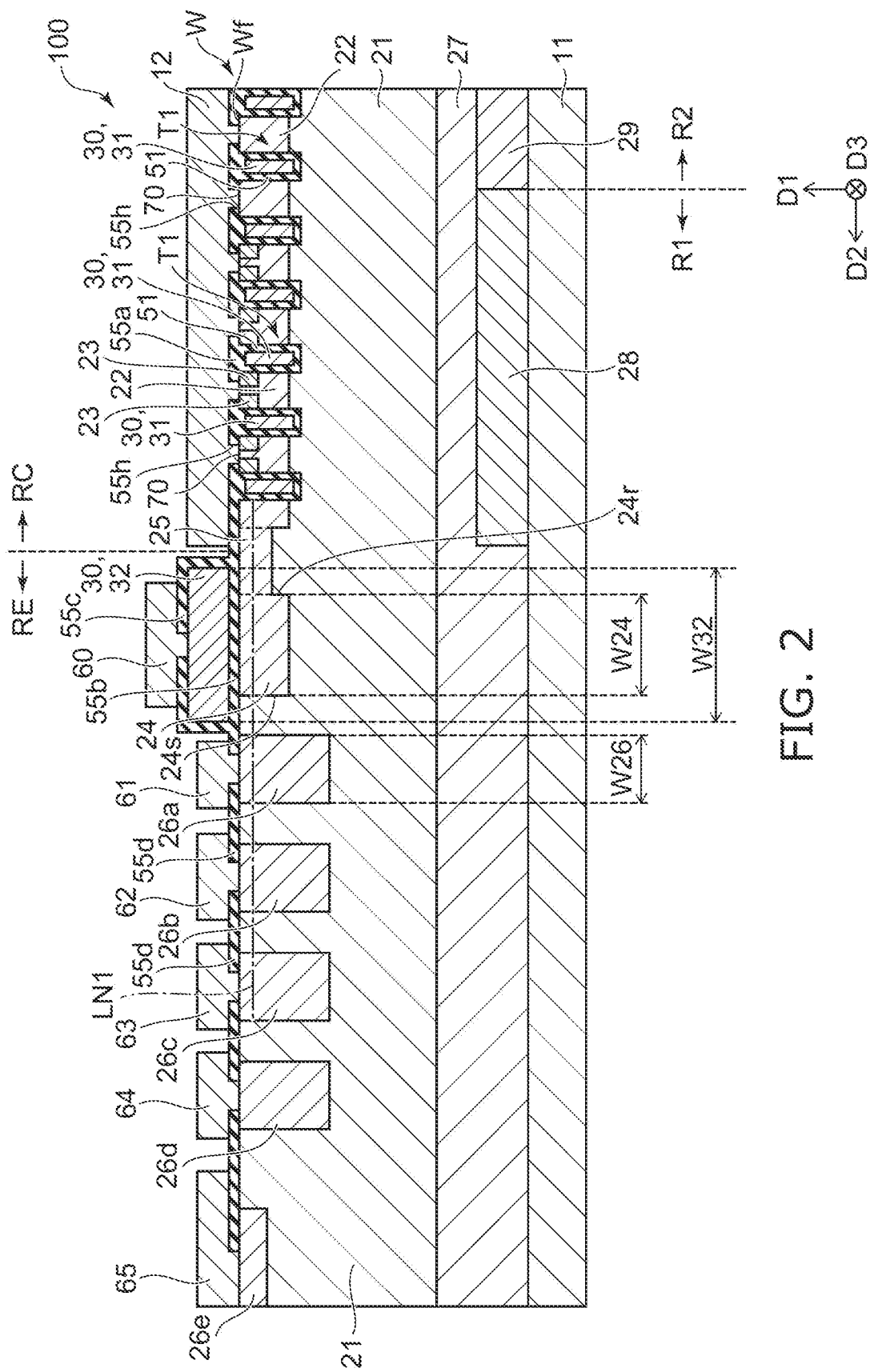
FIG. 2 is a schematic cross-sectional view illustrating the semiconductor device according to the embodiment.

FIG. 2 is a schematic cross-sectional view illustrating the semiconductor device according to the embodiment.

FIG. 1 illustrates a portion of the semiconductor device 100 according to the embodiment. The semiconductor device 100 according to the embodiment includes a cell region RC, and a termination region RE that surrounds the cell region RC. For example, an element such as an IGBT, a MOSFET, a diode, or the like is located in the cell region RC.

The electrodes, wiring, insulating films, etc., located at the surface of the semiconductor device 100 are not illustrated as appropriate in FIG. 1; and the layout of the underlying layers is illustrated. However, the position of a second electrode 12 that is described below is illustrated by a broken line; and the positions of contacts 70 are illustrated by solid lines.

FIG. 2 is a cross-sectional view corresponding to a cross section along line A-A shown in FIG. 1.

As illustrated in FIG. 2, the semiconductor device 100 includes a first electrode 11 (e.g., a collector electrode or a cathode), a semiconductor region 27 located on the first electrode 11, and a first semiconductor region 21 located on the semiconductor region 27. The semiconductor region 27 contacts the first electrode 11 and the first semiconductor region 21 and is electrically connected to the first electrode 11 and the first semiconductor region 21. The semiconductor region 27 and the first semiconductor region 21 each are of a first conductivity type (e.g., an n-type). The first-conductivity-type impurity concentration of the semiconductor region 27 is greater than the first-conductivity-type impurity concentration of the first semiconductor region 21.

Also included in the cell region RC (e.g., an IGBT region R1) are a semiconductor region 28 (e.g., a collector region), a second semiconductor region 22 (e.g., a base region or an anode region), multiple third semiconductor regions 23 (e.g., emitter regions), multiple first conductive regions 31 (e.g., gate electrodes), multiple insulating films 51 (e.g., gate insulating films), and the second electrode 12 (e.g., an emitter electrode or an anode).

A first direction D1, a second direction D2, and a third direction D3 are used in the description of the embodiment. The direction from the first electrode 11 toward the second electrode 12 is taken as the first direction D1. One direction perpendicular to the first direction D1 is taken as the second direction D2. A direction that is perpendicular to the first direction D1 and perpendicular to the second direction D2 is taken as the third direction D3. In the description, the direction from the first electrode 11 toward the second electrode 12 is called "up", and the opposite direction is called "down". These directions are based on the relative positional relationship between the first electrode 11 and the second electrode 12 and are independent of the direction of gravity.

The semiconductor region 28 is located between the first electrode 11 and the semiconductor region 27. The semiconductor region 28 contacts the first electrode 11 and the semiconductor region 27 and is electrically connected to the first electrode 11 and the semiconductor region 27. The semiconductor region 28 is of a second conductivity type (e.g., a p-type).

The second semiconductor region 22 is located on a portion of the first semiconductor region 21 and electrically connected with the first semiconductor region 21. The second semiconductor region 22 is of the second conductivity type.

The third semiconductor region 23 is located on a portion of the second semiconductor region 22 and electrically connected with the second semiconductor region 22. The third semiconductor region 23 is of the first conductivity type. The first-conductivity-type impurity concentration of the third semiconductor region 23 is greater than the first-conductivity-type impurity concentration of the first semiconductor region 21 and greater than the first-conductivity-type impurity concentration of the semiconductor region 27.

The first conductive region 31 faces the side surface of the first semiconductor region 21, the side surface of the second semiconductor region 22, and the side surface of the third semiconductor region 23 via the insulating film 51. That is, the first conductive region 31 is arranged in the second direction D2 with the first to third semiconductor regions 21 to 23. The multiple first conductive regions 31 are arranged in the second direction D2; and each first conductive region 31 extends in the third direction D3.

As illustrated in FIG. 2, multiple trenches T1 are provided in a semiconductor substrate W that includes the first to third semiconductor regions 21 to 23, etc. The trenches T1 are recesses provided in a surface Wf of the semiconductor substrate W. The trenches T1 reach the first semiconductor region 21 from the surface Wf. That is, the trenches T1 are positioned on the first semiconductor region 21 and arranged in the second direction D2 with the second and third semiconductor regions 22 and 23. The multiple trenches T1 are arranged in the second direction D2; and each trench T1 extends in the third direction D3 (an extension direction).

The first conductive regions 31 and the insulating films 51 are located inside the trenches T1. Specifically, the insulating films 51 are located at the inner walls (the bottom surfaces and the side surfaces) of the trenches T1; and the first conductive regions 31 are located inside the insulating films 51. A portion of the second semiconductor region 22 and two third semiconductor regions 23 are located between the trenches T1 that are next to each other.

The second electrode 12 is located on the second and third semiconductor regions 22 and 23 and electrically connected with the second and third semiconductor regions 22 and 23. An insulating film 55a is located between the second electrode 12 and the first conductive region 31. The second electrode 12 is electrically insulated from the first conductive region 31 (a conductive part 30).

The second electrode 12 includes the multiple contacts 70. The contacts 70 are portions of the second electrode 12 that contact the second and third semiconductor regions 22 and 23. For example, as illustrated in FIG. 2, the contacts 70 are the portions of the second electrode 12 located inside holes 55h that extend through the insulating film 55a. The multiple contacts 70 are arranged with the second direction D2 and extend in the third direction D3. One contact 70 is located between two first conductive regions 31 (trenches T1) that are next to each other when viewed from above.

The semiconductor device 100 may be a reverse-conducting IGBT in which an IGBT and a diode are provided together inside one chip. In such a case, for example, as illustrated in FIG. 2, the IGBT region R1 and a diode region R2 are set in the cell region RC. The diode region R2 is arranged with the IGBT region R1 in a direction (e.g., the second direction D2) perpendicular to the first direction D1. Compared to the IGBT region R1, the diode region R2 includes a semiconductor region 29 (e.g., a cathode region) instead of the semiconductor region 28, and does not include the third semiconductor region 23. The first conductive region 31 that is located in the diode region R2 may be electrically connected with the second electrode 12.

The semiconductor region 29 is arranged in the second direction D2 with the semiconductor region 28 and positioned between the first electrode 11 and the semiconductor region 27. The semiconductor region 29 contacts the first electrode 11 and the semiconductor region 27 and is electrically connected to the first electrode 11 and the semiconductor region 27. The semiconductor region 29 is of the first conductivity type. The first-conductivity-type impurity concentration of the semiconductor region 29 is greater than the first-conductivity-type impurity concentration of the semiconductor region 27.

For example, as illustrated in FIG. 2, the semiconductor device 100 includes a fourth semiconductor region 24, a sixth semiconductor region 26a (e.g., a guard ring), semiconductor regions 26b to 26d (e.g., guard rings), a semiconductor region 26e (e.g., an EQPR (EQuivalent-Potential Ring) region), a second conductive region 32, a wiring part 60 (e.g., gate wiring), and conductive layers 61 to 65 in the termination region RE.

As illustrated in FIG. 2, the second conductive region 32 is arranged with the second electrode 12 in a direction perpendicular to the first direction D1. The second conductive region 32 is located around the second electrode 12. The second conductive region 32 has a substantially rectangular ring shape surrounding the outer perimeter (the entire perimeter) of the second electrode 12 when viewed from above.

The second conductive region 32 is continuous with the first conductive regions 31 and electrically connected with the first conductive regions 31. As illustrated in FIG. 1, the two ends in the third direction D3 of each first conductive region 31 are connected respectively to the two sides of the second conductive region 32 separated in the third direction D3 (the regions extending in the second direction D2).

For example, the first conductive regions 31 and the second conductive region 32 are formed to have a continuous body of the same material. The first conductive regions 31 and the second conductive region 32 each may be a portion of one continuous conductive part 30. The second conductive region 32 is the portion of the conductive part 30 positioned higher than the surface Wf of the semiconductor substrate W. The first conductive regions 31 are the portions that are lower than the surface Wf of the semiconductor substrate W and located inside the trenches T1.

As illustrated in FIG. 2, the fourth semiconductor region 24 is arranged with the second semiconductor region 22 in a direction perpendicular to the first direction D1. The fourth semiconductor region 24 is located around the second semiconductor region 22. The fourth semiconductor region 24 has a substantially rectangular ring shape surrounding the outer perimeter (the entire perimeter) of the second semiconductor region 22 when viewed from above. The fourth semiconductor region 24 is electrically connected with the second semiconductor region 22. The fourth semiconductor region 24 is of the second conductivity type. The second-conductivity-type impurity concentration of the fourth semiconductor region 24 may be equal to the second-conductivity-type impurity concentration of the second semiconductor region 22.

According to the embodiment, "same" or "equal" includes not only exactly the same or equal but also substantially the same or equal. For example, the range of "same" or "equal" includes differences caused by the fluctuation of process conditions.

The fourth semiconductor region 24 includes end portions (an inner end portion 24r and an outer end portion 24s) in a direction perpendicular to the first direction D1. The end portion 24r is positioned between the end portion 24s and the second semiconductor region 22. That is, the end portion 24r is the inner perimeter side surface of the ring-shaped fourth semiconductor region 24; and the end portion 24s is the outer perimeter side surface of the ring-shaped fourth semiconductor region 24. The end portion 24s is surrounded with the first semiconductor region 21 and contacts the first semiconductor region 21.

As illustrated in FIG. 2, the fourth semiconductor region 24 is positioned under the second conductive region 32. More specifically, at least a portion of the end portion 24s and at least a portion of the end portion 24r are below the second conductive region 32 and overlap the second conductive region 32 in the first direction D1. At least a portion of the end portion 24s and at least a portion of the end portion 24r are further toward the first electrode 11 side than the second conductive region 32 in a direction along the first direction D1. An insulating film 55b is located between the fourth semiconductor region 24 and the second conductive region 32; and the fourth semiconductor region 24 and the second conductive region 32 are electrically insulated.

For example, a width W32 of the second conductive region 32 is greater than a width W24 of the fourth semiconductor region 24. Thereby, the entire fourth semiconductor region 24 is positioned below the second conductive region 32 and overlaps the second conductive region 32 in the first direction D1. In the example of FIG. 2, the end portion 24s and the end portion 24r of the fourth semiconductor region 24 overlap the wiring part 60 in the first direction D1.

The depth of the fourth semiconductor region 24 may be equal to the depth of the second semiconductor region 22. The trench T1 is deeper than the fourth semiconductor region 24. For example, the fourth semiconductor region 24 can be formed by the same process (an ion implantation process, a heating process, etc.) as the second semiconductor region 22.

In the example, a fifth semiconductor region 25 also is located between the second semiconductor region 22 and the fourth semiconductor region 24. The fifth semiconductor region 25 has a substantially rectangular ring shape surrounding the outer perimeter (e.g., the entire perimeter) of the second semiconductor region 22 when viewed from above. The fifth semiconductor region 25 contacts the outer perimeter of the second semiconductor region 22 and the inner perimeter of the fourth semiconductor region 24. Thus, the fourth semiconductor region 24 is electrically connected with the second semiconductor region 22 via the fifth semiconductor region 25. For example, the outer perimeter of the fifth semiconductor region 25 is positioned under the second conductive region 32; and the inner perimeter of the fifth semiconductor region 25 is positioned under the second electrode 12.

The fifth semiconductor region 25 is of the second conductivity type. The second-conductivity-type impurity concentration of the fifth semiconductor region 25 is less than the second-conductivity-type impurity concentration of the second semiconductor region 22 and less than the second-conductivity-type impurity concentration of the fourth semiconductor region 24. The resistivity of the fifth semiconductor region 25 is greater than the resistivity of the second semiconductor region 22 and greater than the resistivity of the fourth semiconductor region 24. The sheet resistance of the fifth semiconductor region 25 is greater than the sheet resistance of the second semiconductor region 22 and greater than the sheet resistance of the fourth semiconductor region 24. The fifth semiconductor region 25 is shallower than the second semiconductor region 22 and shallower than the fourth semiconductor region 24.

For example, the second-conductivity-type total impurity amount of the second semiconductor region 22 and the second-conductivity-type total impurity amount of the fourth semiconductor region 24 each are not less than $1 \times 10^{13}$ atoms/cm$^2$ and not more than $4 \times 10^{13}$ atoms/cm$^2$. For example, the second-conductivity-type total impurity amount of the fifth semiconductor region 25 is not less than $1 \times 10^{12}$ atoms/cm$^2$ and not more than $4 \times 10^{12}$ atoms/cm$^2$.

The total impurity amount is the number of impurities per unit area in a plane perpendicular to the first direction D1. The total impurity amount is, for example, the integral in the first direction D1 of the number of impurities per unit volume. The impurity concentration is the effective impurity concentration contributing to the conduction of the semiconductor, and is the concentration that excludes the cancelled portion when both an impurity that forms donors and an impurity that forms acceptors are included in one region.

The sixth semiconductor region 26a and the semiconductor regions 26b to 26e each are located on the first semiconductor region 21. The sixth semiconductor region 26a and the semiconductor regions 26b to 26e have substantially rectangular ring shapes surrounding the outer perimeter (the entire perimeter) of the fourth semiconductor region 24 when viewed from above. The sixth semiconductor region 26a and the semiconductor regions 26b to 26e are arranged in a concentric circular configuration and are separated from each other.

That is, the sixth semiconductor region 26a surrounds the outer perimeter of the fourth semiconductor region 24; the semiconductor region 26b surrounds the outer perimeter of the sixth semiconductor region 26a; a semiconductor region 26c surrounds the outer perimeter of the semiconductor region 26*b*; the semiconductor region 26*d* surrounds the outer perimeter of the semiconductor region 26*c*; and the semiconductor region 26*e* surrounds the outer perimeter of the semiconductor region 26*d*. Portions of the first semiconductor region 21 are located between these semiconductor regions (i.e., between the fourth semiconductor region 24 and the sixth semiconductor region 26*a*, between the sixth semiconductor region 26*a* and the semiconductor region 26*b*, between the semiconductor region 26*b* and the semiconductor region 26*c*, between the semiconductor region 26*c* and the semiconductor region 26*d*, and between the semiconductor region 26*d* and the semiconductor region 26*e*).

The sixth semiconductor region 26*a* is of the second conductivity type. The second-conductivity-type impurity concentration of the sixth semiconductor region 26*a* is greater than the second-conductivity-type impurity concentration of the fourth semiconductor region 24. The sixth semiconductor region 26*a* is deeper than the fourth semiconductor region 24 and deeper than the trench T1. A width W26 of the sixth semiconductor region 26*a* may be greater than the width W24 of the fourth semiconductor region 24. For example, the second-conductivity-type total impurity amount of the sixth semiconductor region 26*a* is not less than $1\times10^{17}$ atoms/cm$^2$ and not more than $1\times10^{18}$ atoms/cm$^2$. This is similar for the semiconductor regions 26*b* to 26*d* as well. The semiconductor region 26*e* is of the first conductivity type.

As illustrated in FIG. 2, the wiring part 60 is located on the second conductive region 32 and contacts the second conductive region 32. An insulating film 55*c* is located at a portion between the wiring part 60 and the second conductive region 32.

The conductive layer 61 is located on the sixth semiconductor region 26*a* and contacts the sixth semiconductor region 26*a*. Similarly, conductive layers 62 to 65 are located respectively on the semiconductor regions 26*b* to 26*e* and respectively contact the semiconductor regions 26*b* to 26*e*. An insulating film 55*d* is located below the conductive layers 61 to 65.

Figure 3:
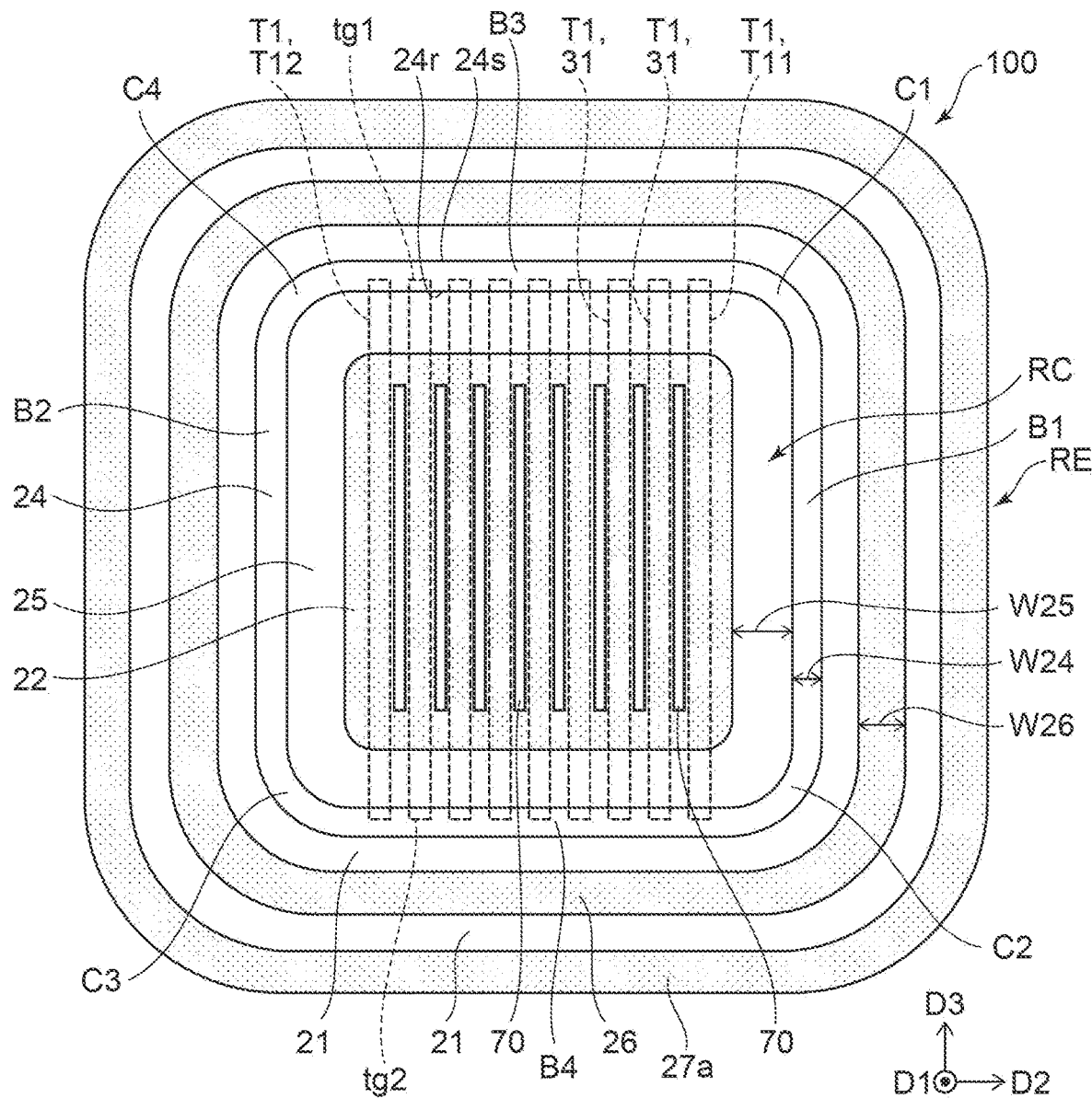
FIG. 3 is a schematic plan view illustrating the semiconductor device according to the embodiment.

FIG. 3 is a schematic plan view illustrating the semiconductor device according to the embodiment.

FIG. 3 is the illustration of FIG. 1 in which the conductive part 30 is not illustrated. The positions of the trenches T1 (the first conductive regions 31) in FIG. 3 are illustrated by broken lines.

As illustrated in FIG. 3, the fourth semiconductor region 24 includes four extension parts B1 to B4 that correspond to the four sides. The extension part B1 and the extension part B2 extend in the third direction D3. The extension part B3 and the extension part B4 extend in the second direction D2. The fourth semiconductor region 24 also includes corner portions C1 to C4 that connect the extension parts to each other. The corner portion C1 connects the extension parts B1 and B3. The corner portion C2 connects the extension parts B1 and B4. The corner portion C3 connects the extension parts B2 and B4. The corner portion C4 connects the extension parts B2 and B3.

The extension part B1 and the extension part B2 are arranged in the second direction D2 with the multiple contacts 70. The contact 70 is not located between the extension part B1 and a trench T11 among the multiple trenches T1 most proximate to the extension part B1. Similarly, the contact 70 is not located between the extension part B2 and a trench T12 among the multiple trenches T1 most proximate to the extension part B2.

The central portion of the third direction D3 of the trench T1 (the first conductive region 31) is positioned in the cell region RC; and the two end portions of the third direction D3 of the trench T1 (the first conductive region 31) extend to the termination region RE. More specifically, one end portion tg1 in the third direction D3 of the trench T1 extends to the extension part B3; and another end portion tg2 in the third direction D3 of the trench T1 (the first conductive region 31) extends to the extension part 64. The end portion tg1 and the end portion tg2 each are positioned outward of the inner perimeter of the fourth semiconductor region 24 and inward of the outer perimeter of the fourth semiconductor region 24.

A width W25 of the fifth semiconductor region 25 may be greater or less than the width W24 of the fourth semiconductor region 24.

Figure 4:
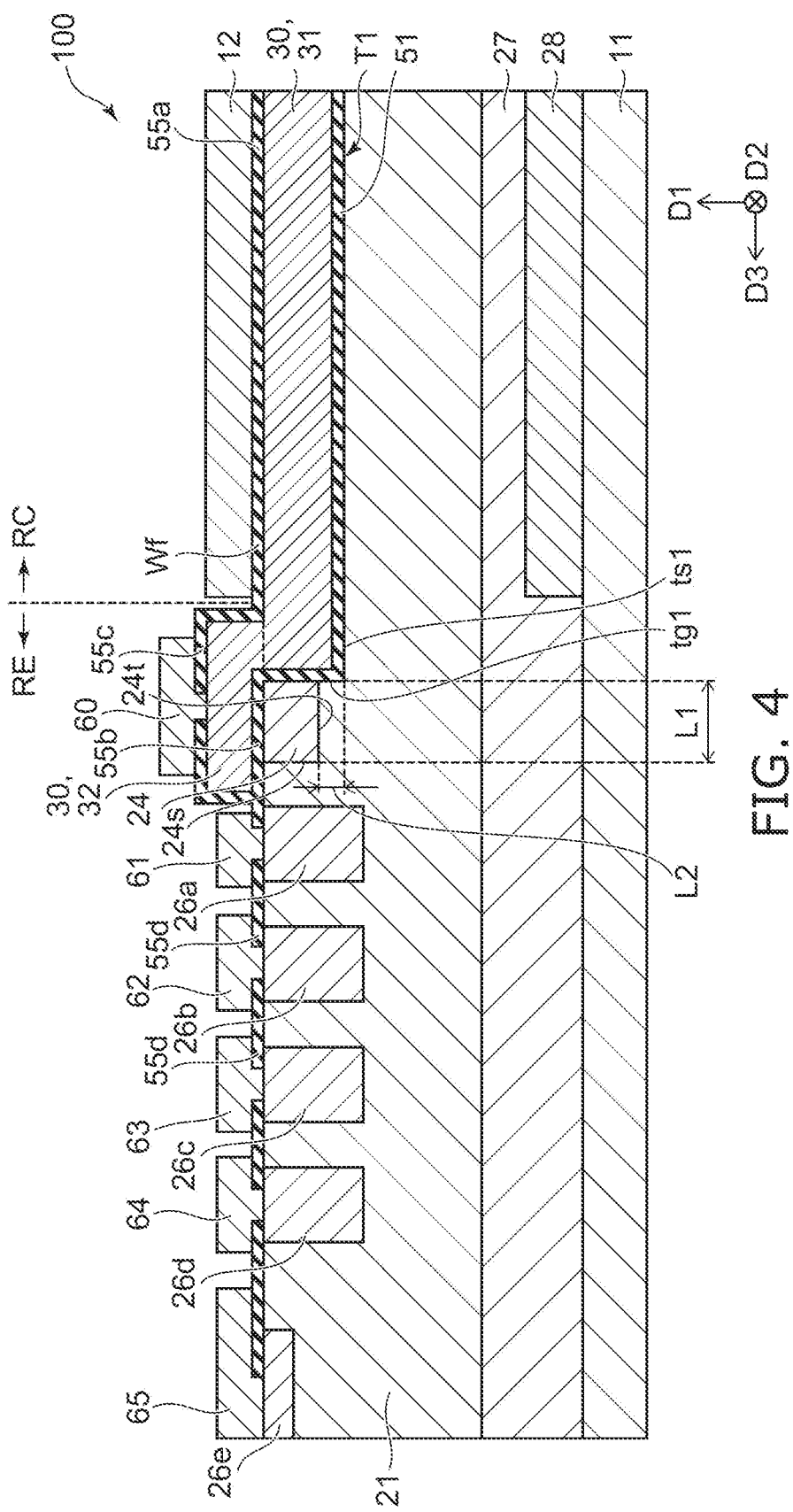
FIG. 4 is a schematic cross-sectional view illustrating the semiconductor device according to the embodiment.

FIG. 4 is a schematic cross-sectional view illustrating the semiconductor device according to the embodiment.

FIG. 4 is a cross-sectional view corresponding to a cross section along line B-B shown in FIG. 1.

The fourth semiconductor region 24 contacts the end portion tg1 of the trench T1. A distance L1 (the shortest distance along the third direction D3) between the end portion 24*s* of the fourth semiconductor region 24 and the end portion tg1 of the trench T1 is greater than zero, e.g., not less than 5.0 μm (micrometers) and not more than 25 μm.

The depth (the length along the first direction D1) of the trench T1 is, for example, not less than 4.0 μm and not more than 6.0 μm. A distance L2 along the first direction D1 between a lower end ts1 of the trench T1 and a lower end 24*t* of the fourth semiconductor region 24 is, for example, not less than 0.5 μm and not more than 4.0 μm.

Examples of the materials of the components of the semiconductor device 100 will now be described.

The first to fifth semiconductor regions 21 to 25, the sixth semiconductor region 26*a*, and the semiconductor regions 26*b* to 26*e* and 27 to 29 include silicon, silicon carbide, gallium nitride, or gallium arsenide as semiconductor materials. When silicon is used as the semiconductor material, arsenic, phosphorus, or antimony can be used as the n-type impurity. Boron can be used as the p-type impurity.

The conductive part 30 (the first conductive region 31 and the second conductive region 32) includes a conductive material such as polysilicon, etc. An impurity may be added to the conductive material.

The insulating films 51 and 55*a* to 55*d* include insulating materials such as silicon oxide, silicon nitride, etc.

The first electrode 11, the second electrode 12, the wiring part 60, and the conductive layers 61 to 65 are conductive parts that includes metals such as aluminum, copper, etc.

Operations of the semiconductor device 100 will now be described.

For example, the cell region RC of the semiconductor device 100 operates as an IGBT when a positive potential is applied to the first electrode 11 and a negative potential is applied to the second electrode 12. On the other hand, the cell region RC operates as a diode when a negative potential is applied to the first electrode 11 and a positive potential is applied to the second electrode 12.

More specifically, a voltage that is not less than a threshold is applied to the first conductive region 31 in a state in which a positive voltage with respect to the second electrode 12 is applied to the first electrode 11. Thereby, a channel is formed in the second semiconductor region 22 in the IGBT region R1; and the IGBT region R1 is set to the on-state. As electrons pass through the channel and flow toward the first semiconductor region 21, holes are injected from the semiconductor region 28 into the first semiconductor region 21.

The electrical resistance of the semiconductor device 100 is greatly reduced by the conductivity modulation occurring in the first semiconductor region 21. Subsequently, when the voltage that is applied to the first conductive region 31 drops below the threshold, the channel in the third semiconductor region 23 disappears, and the IGBT region R1 is switched to the off-state.

The p-n junction between the first semiconductor region 21 and the second semiconductor region 22 in the diode region R2 has a reverse bias in the state in which the positive voltage with respect to the second electrode 12 is applied to the first electrode 11. Conversely, the p-n junction has a forward bias in the state in which a positive voltage with respect to the first electrode 11 is applied to the second electrode 12.

Effects of the embodiment will now be described with reference to a semiconductor device according to a reference example.

Figure 5:
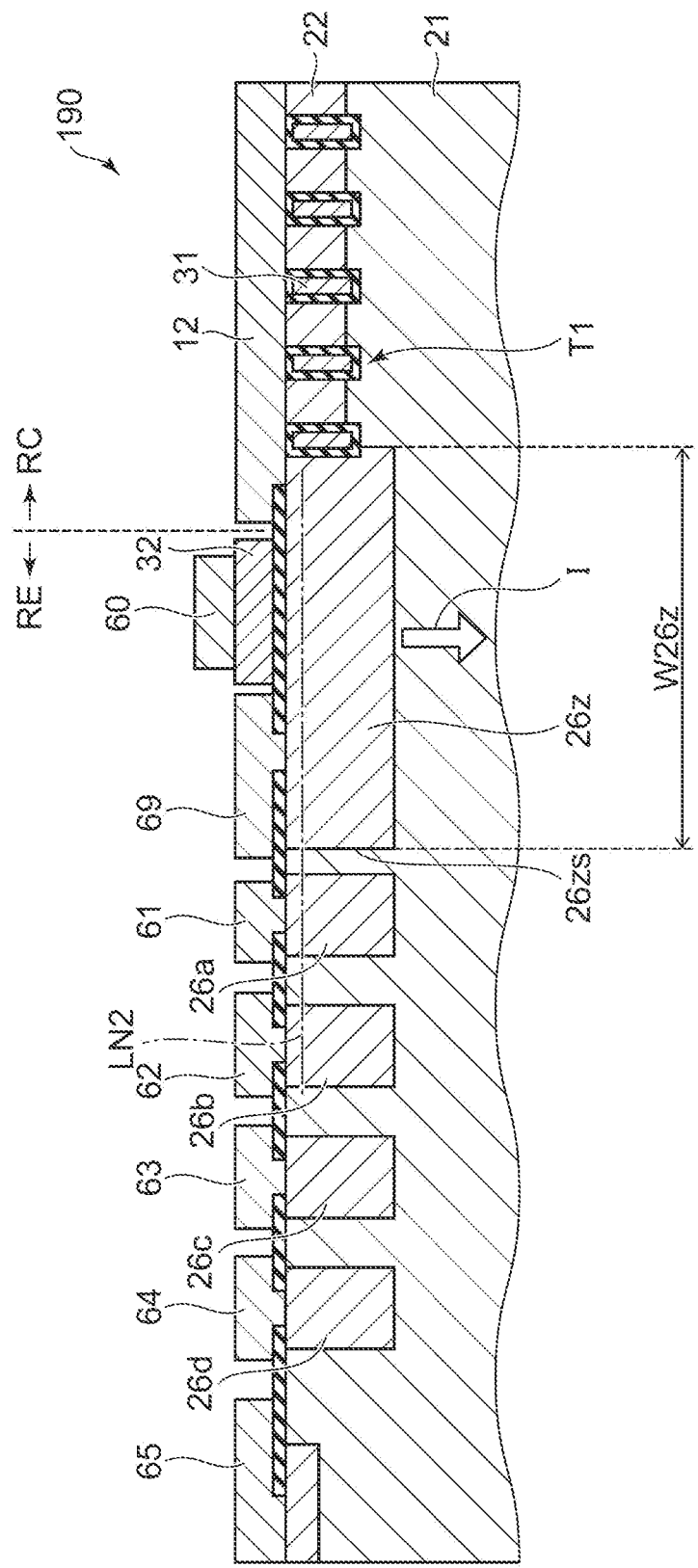
FIG. 5 is a schematic cross-sectional view illustrating the semiconductor device according to the reference example.

FIG. 5 is a schematic cross-sectional view illustrating the semiconductor device according to the reference example.

Similarly to FIG. 2, FIG. 5 illustrates a cross section of a portion of the semiconductor device 190 according to the reference example. Compared to the semiconductor device 100 according to the embodiment, the semiconductor device 190 includes a semiconductor region 26z and a conductive layer 69 instead of the fourth and fifth semiconductor regions 24 and 25.

The semiconductor region 26z has a substantially rectangular ring shape surrounding the outer perimeter of the second semiconductor region 22. The semiconductor region 26z is of the second conductivity type. The semiconductor region 26z contacts the outer perimeter of the second semiconductor region 22 and is electrically connected with the second semiconductor region 22.

The wiring part 60 (the gate wiring) is located on the semiconductor region 26z. The conductive layer 69 also is located on the semiconductor region 26z. An outer perimeter 26zs of the semiconductor region 26z is positioned below the conductive layer 69. For example, the conductive layer 69 has a ring shape overlapping the outer perimeter 26zs of the semiconductor region 26z when viewed from above. The conductive layer 69 contacts the semiconductor region 26z and is electrically connected with the semiconductor region 26z. By including the conductive layer 69, for example, the electric field at the vicinity of the outer perimeter 26zs of the semiconductor region 26z can be suppressed.

Thus, the semiconductor region 26z is located below the wiring part 60 and the conductive layer 69 outward of the wiring part 60. Therefore, a width W26z of the semiconductor region 26z is relatively wide. Here, in the forward bias state (in which the first electrode 11 has a negative potential and the second electrode 12 has a positive potential), there are cases where a hole current (a current I in FIG. 5) may inflow from the second electrode 12 via the second semiconductor region 22 and the semiconductor region 26z to the termination region below the semiconductor region 26z. An excessive hole current easily flows when the width of the semiconductor region 26z is relatively wide. For example, the ratio of the termination region RE (e.g., the ineffective region that does not directly contribute to the element characteristics) relatively increases as the cell region RC decreases. In such a case, the hole current that inflows via the semiconductor region 26z may not be negligible.

In contrast, in the semiconductor device 100 according to the embodiment, the fourth semiconductor region 24 is included instead of the semiconductor region 26z. As described with reference to FIG. 2, etc., the end portion 24s of the fourth semiconductor region 24 is positioned below the second conductive region 32. At least a portion of the end portion 24s is positioned further toward the first electrode 11 side than the second conductive region 32 in a direction along the first direction D1. A relatively narrow width of the fourth semiconductor region 24 can be formed thereby. Accordingly, the hole current that flows into the termination region via the fourth semiconductor region 24 can be suppressed compared to the hole current inflowing via the semiconductor region 26z in the semiconductor device 190. Also, by positioning the second conductive region 32 above the end portion 24s, for example, the electric field at the end portion 24s vicinity can be suppressed.

As described above, the first conductive region 31 is located inside the trench T1. Thereby, the cell region RC can be downscaled compared to a planar transistor; and the on-resistance can be reduced. Thus, according to the embodiment, the hole current that inflows via the fourth semiconductor region 24 can be suppressed even when the cell region RC is made smaller and the relative ratio of the termination region RE is increased. However, the semiconductor device according to the embodiment may include a planar transistor.

The depth of the semiconductor region 26z of the reference example is, for example, deeper than the trench T1 and equal to the depth of the sixth semiconductor region 26a. The second-conductivity-type impurity concentration of the semiconductor region 26z is greater than the second-conductivity-type impurity concentration of the second semiconductor region 22 and is equal to the second-conductivity-type impurity concentration of the sixth semiconductor region 26a. In contrast, the semiconductor device 100 according to the embodiment, the second-conductivity-type impurity concentration of the fourth semiconductor region 24 is less than the second-conductivity-type impurity concentration of the sixth semiconductor region 26a. The second-conductivity-type total impurity amount of the fourth semiconductor region 24 is less than the second-conductivity-type total impurity amount of the sixth semiconductor region 26a. The electrical resistance in the fourth semiconductor region 24 is increased thereby, and the hole current that inflows via the fourth semiconductor region 24 can be suppressed.

The semiconductor device 100 further includes the fifth semiconductor region 25 described above. The second-conductivity-type total impurity amount of the fifth semiconductor region 25 is less than the second-conductivity-type total impurity amount of the fourth semiconductor region 24. The second-conductivity-type impurity concentration of the fifth semiconductor region 25 is less than the second-conductivity-type impurity concentration of the fourth semiconductor region 24. The electrical resistivity in the fifth semiconductor region 25 is greater than the electrical resistivity in the fourth semiconductor region 24. The hole current that inflows via the fifth and fourth semiconductor regions 25 and 24 can be further suppressed thereby.

In reverse bias (when the first electrode 11 has a positive potential and the second electrode 12 has a negative potential), a depletion layer spreads toward the first semiconductor region 21 from the p-n junction surface between the fourth semiconductor region 24 and the first semiconductor region 21 and from the interface between the trench T1 and the first semiconductor region 21. When the depletion layer spreads in the first semiconductor region 21, there are cases where avalanche breakdown occurs due to carriers (electrons and holes) generated by impact ionization, etc., being accelerated in the depletion layer.

Here, as described above with reference to FIG. 4, the distance L1 between the end portion 24s of the fourth semiconductor region 24 and the end portion tg1 of the trench T1 is, for example, not more than 25 μm. When the distance L1 is short and the end portion 24s of the fourth semiconductor region 24 approaches the end portion tg1 of the trench T1, for example, the electric field at the lower end vicinity of the end portion tg1 of the trench T1 easily becomes stronger than at the end portion 24s vicinity of the fourth semiconductor region 24. Thereby, avalanche breakdown occurs more easily at the lower end vicinity of the end portion tg1 of the trench T1 than at the vicinity of the fourth semiconductor region 24; and the breakdown voltage is reduced.

The trench T1 is deeper than the fourth semiconductor region 24. As described above with reference to FIG. 4, the distance L2 between the lower end 24t of the fourth semiconductor region 24 and the lower end ts1 of the trench T1 is greater than zero, e.g., not less than 0.5 μm and not more than 4.0 μm. When the distance L2 is increased and the lower end ts1 of the trench T1 is separated from the fourth semiconductor region 24, for example, the electric field increases more easily at the lower end vicinity of the end portion tg1 of the trench T1 than at the end portion 24s vicinity of the fourth semiconductor region 24. Thereby, avalanche breakdown occurs more easily at the end portion tg1 vicinity of the trench T1 than at the vicinity of the fourth semiconductor region 24; and the breakdown voltage is reduced.

For example, when avalanche breakdown occurs at the vicinity of the extension part B1, the extension part B2, or the corner portions C1 to C4 of the fourth semiconductor region 24 described with reference to FIG. 3, for example, there is a risk that the current may concentrate in locations at the vicinity of the extension part B1, the extension part B2, or the corner portions C1 to C4 at which the breakdown voltage is particularly low, etc. In contrast, in the semiconductor device 100, by adjusting at least one of the distance L1 or the distance L2 as described above, avalanche breakdown can occur more easily at the lower end vicinity of the end portion tg1 of the trench T1 than at the vicinity of the extension part B1, the extension part B2, and the corner portions C1 to C4. When multiple trenches T1 are provided, avalanche breakdown occurs easily at the end portion vicinity of each trench T1. The locations (the avalanche points) at which avalanche breakdown occurs can be dispersed thereby, and the current concentration can be suppressed. For example, breakdown of the element can be suppressed.

For example, in the semiconductor device 100, the breakdown voltage of the corner portion (e.g., the breakdown voltage between the corner portion C1 and a portion of the first semiconductor region 21 next to the corner portion C1) is less than the breakdown voltage of the extension part (e.g., the breakdown voltage between the extension part B3 and a portion of the first semiconductor region 21 next to the extension part B3). The current concentration at the corner portion can be suppressed thereby. For example, when avalanche breakdown due to the reverse bias occurs, the currents that flow in the corner portions C1 to C4 are less than the current flowing in the extension part B3 or the extension part B4.

As described above with reference to FIG. 3, the contact 70 is not located between the extension part B1 and the trench T11 among the multiple trenches T1 most proximate to the extension part B1 when viewed from above. That is, the second semiconductor region 22 does not contact the second electrode 12 in the region between the trench T11 and the extension part B1. If avalanche breakdown occurs at the vicinity of the extension part B1, the holes flow around the trench T11 from the vicinity of the extension part B1 and flow toward the contact 70. Because the current flows around the trench T11, the path of the current from the extension part B1 to the contact 70 is longer, and the resistance is increased. The current that flows in the extension part B1 is suppressed thereby, and the current concentration at the extension part B1 can be suppressed. Similarly, the current concentration at the extension part B2 can be suppressed.

Figure 6:
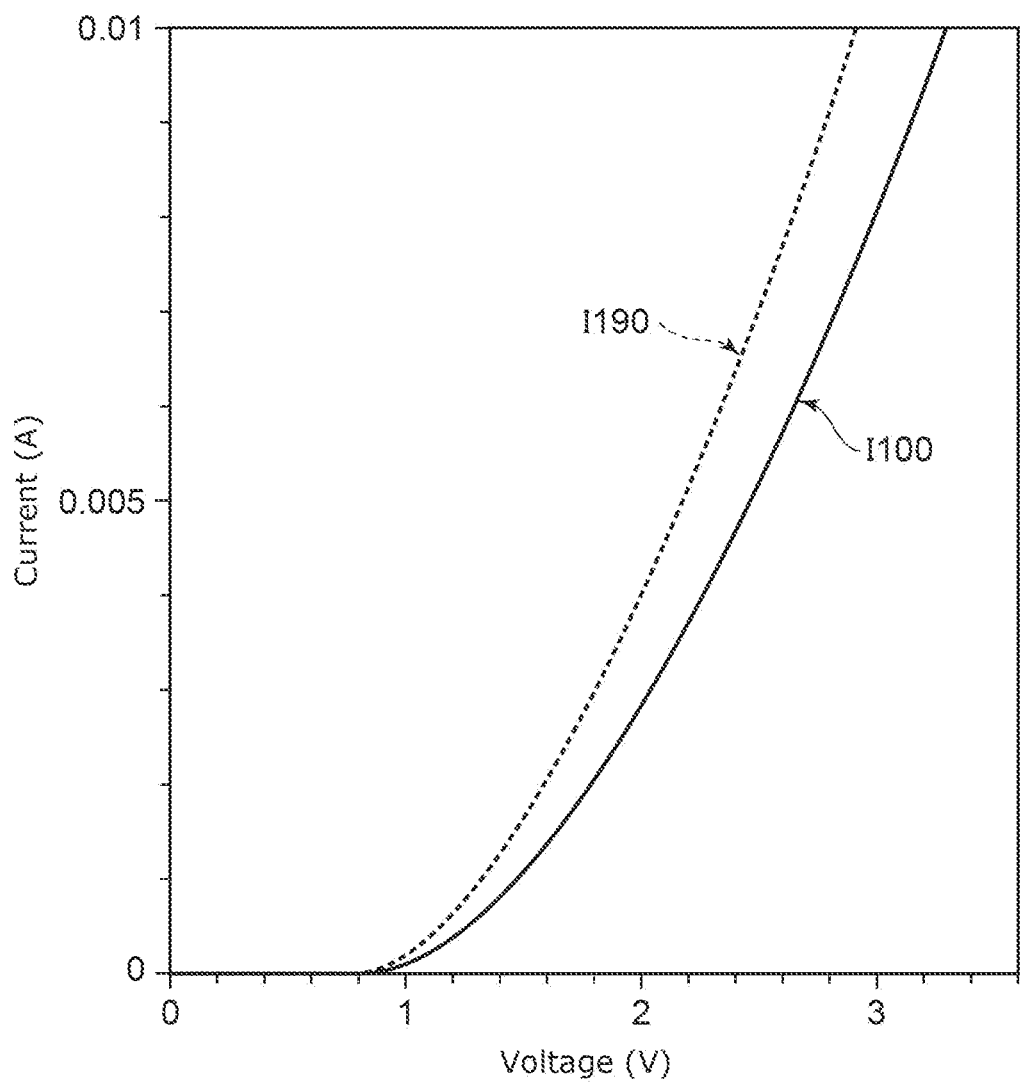
FIG. 6 is a graph illustrating simulation results of characteristics of semiconductor devices.

FIG. 6 is a graph illustrating simulation results of characteristics of semiconductor devices.

FIG. 6 illustrates the I-V characteristic when a forward bias is applied. Namely, FIG. 6 illustrates the relationship between the voltage of the second electrode 12 with respect to the first electrode 11 and the current flowing from the second electrode 12 toward the first electrode 11. A current I100 illustrates the I-V characteristic of the semiconductor device 100; and a current I190 illustrates the I-V characteristic of the semiconductor device 190.

As illustrated in FIG. 6, the current I100 is less than the current I190. The semiconductor device 100 does not include the semiconductor region 26z of the semiconductor device 190; therefore, the inflow of an excessive hole current from the semiconductor region 26z as described above can be suppressed.

Figure 7:
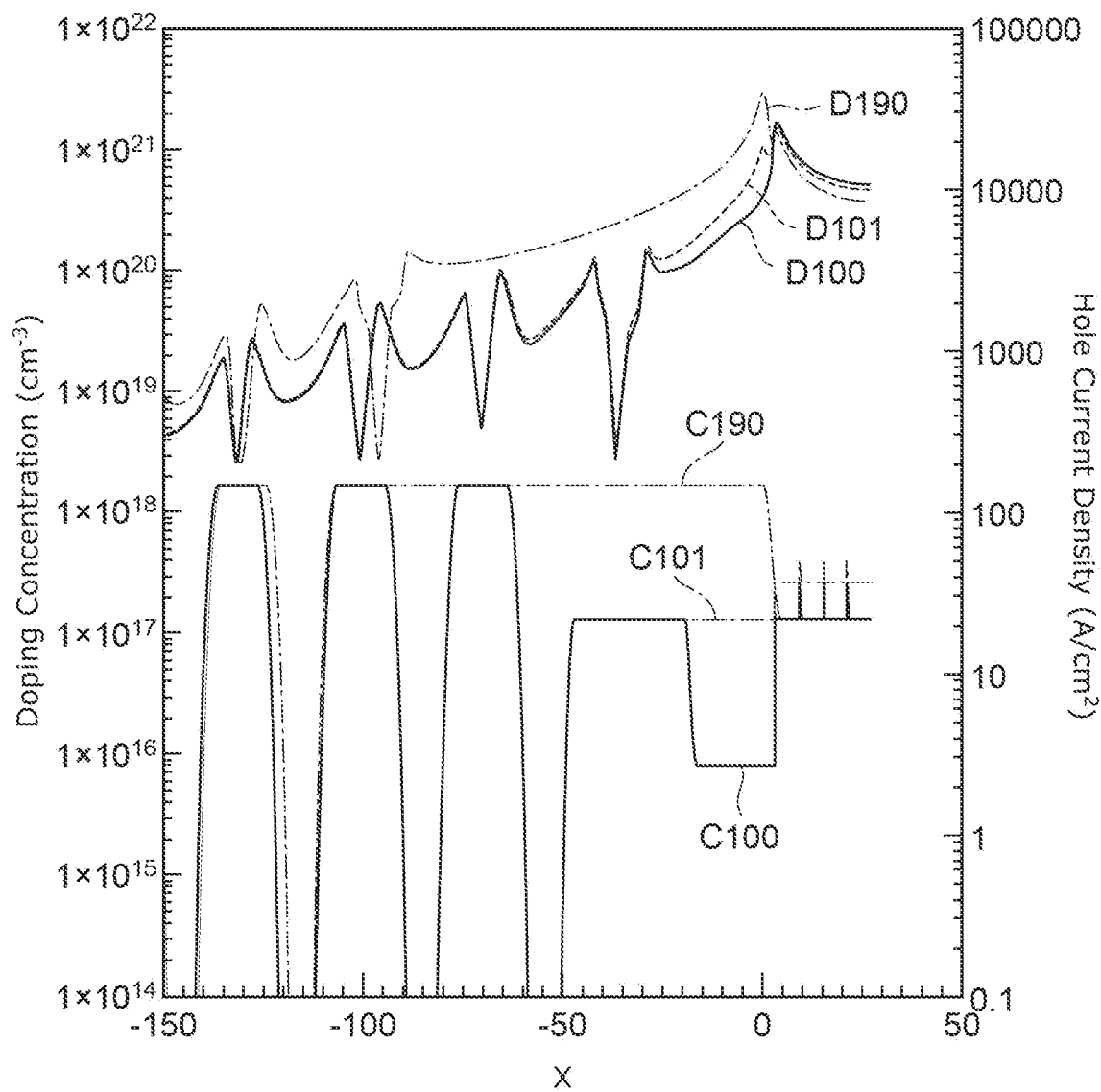
FIG. 7 is a graph illustrating simulation results of characteristics of the semiconductor devices.

FIG. 7 is a graph illustrating simulation results of characteristics of the semiconductor devices.

The horizontal axis (x) of FIG. 7 is the position in the second direction D2 of the semiconductor device. Specifically, the horizontal axis of FIG. 7 corresponds to the position along a line LN1 shown in FIG. 2 or the position along a line LN2 shown in FIG. 5. The vertical axis at the left side of FIG. 7 is the doping concentration of the second-conductivity-type impurity. A concentration C100 illustrates the doping concentration of the semiconductor device 100; and a concentration C190 illustrates the doping concentration of the semiconductor device 190. The semiconductor device 190 includes the semiconductor region 26z; therefore, the doping concentration is high in a wide range (the vicinity of $-110 \leq x \leq 0$) corresponding to the semiconductor region 26z. On the other hand, instead of the semiconductor region 26z, the semiconductor device 100 includes the fourth semiconductor region 24 (the vicinity of $-50 \leq x \leq -20$) and the fifth semiconductor region 25 (the vicinity of $-20 \leq x \leq 0$) having low doping concentrations and narrow widths.

FIG. 7 also shows a concentration C101. The concentration C101 illustrates the doping concentration of a semiconductor device 101 in which the fifth semiconductor region 25 of the semiconductor device 100 is omitted, and the fourth semiconductor region 24 is extended to the second semiconductor region 22 instead.

The vertical axis at the right side of FIG. 7 is the hole current density. A current density D100 illustrates the hole current density of the semiconductor device 100; a current density D101 illustrates the hole current density of the semiconductor device 101; and a current density D190 illustrates the current density of the semiconductor device 190.

As illustrated in FIG. 7, the current density D100 and the current density D101 each are less than the current density D190 in a wide area of the semiconductor region 26z. The semiconductor device 100 (and the semiconductor device 101) do not include the semiconductor region 26z of the semiconductor device 190; therefore, the inflow of the excessive hole current from the semiconductor region 26z as described above can be suppressed.

Figure 8:
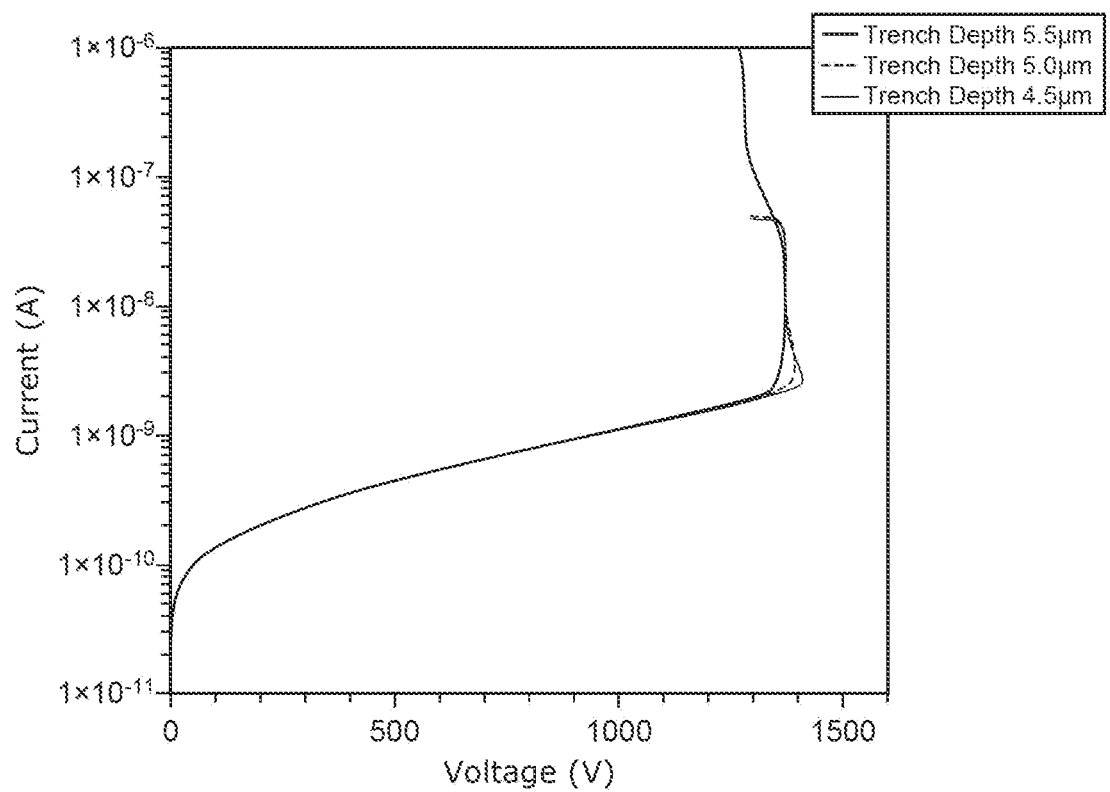
FIG. 8 is a graph illustrating simulation results of a characteristic of the semiconductor device according to the embodiment.

FIG. 8 is a graph illustrating simulation results of a characteristic of the semiconductor device according to the embodiment.

FIG. 8 illustrates the I-V characteristic when a reverse bias is applied. Namely, FIG. 8 illustrates the relationship between the voltage of the first electrode 11 with respect to the second electrode 12 and the current flowing from the first electrode 11 toward the second electrode 12. In FIG. 8, the depth of the trench T1 of the semiconductor device 100 is 4.5 μm, 5.0 μm, and 5.5 μm.

As illustrated in FIG. 8, a shallower trench T1 causes a larger voltage value when the current value abruptly increases from the vicinity of $2\times10^{-9}$ A. In other words, for example, the breakdown voltage can be increased by making the trench T1 shallower and causing the lower end ts1 of the trench T1 to approach the lower end 24t of the fourth semiconductor region 24.

On the other hand, when the trench T1 is made shallower and the depth of the trench T1 is 4.5 μm or 5.0 μm, a negative resistance occurs when the current value abruptly increases from the vicinity of $2\times10^{-9}$ A. For example, it is considered that avalanche breakdown does not easily occur at the lower end vicinity of the end portion tg1 of the trench T1 when the trench T1 is made shallower because the lower end ts1 of the trench T1 approaches the fourth semiconductor region 24. In such a case, for example, it is estimated that avalanche breakdown occurs relatively easily at the vicinity of the extension part B1, the extension part B2, or the corner portions C1 to C4, and the current easily concentrates particularly at locations of low breakdown voltage, which causes the negative resistance to occur. By making the trench T1 deeper, avalanche breakdown can easily occur at the end portion vicinity of each trench T1; the avalanche points can be dispersed; and the current concentration can be suppressed. According to the embodiment, it is favorable for the trench T1 to be, for example, not less than 5.5 μm.

Figure 9A:
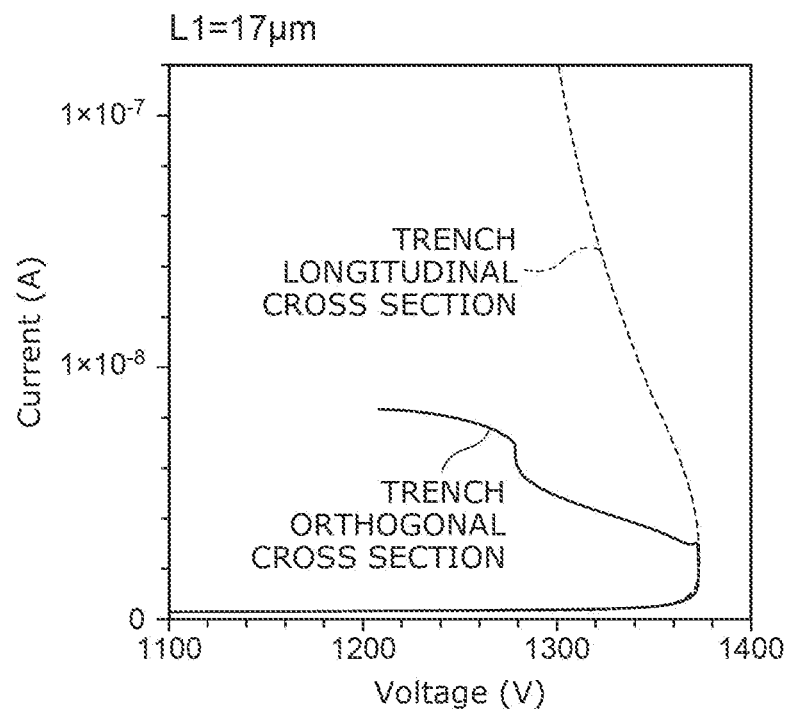
FIGS. 9A and 9B are graphs illustrating simulation results of characteristics of the semiconductor device according to the embodiment.
Figure 9B:
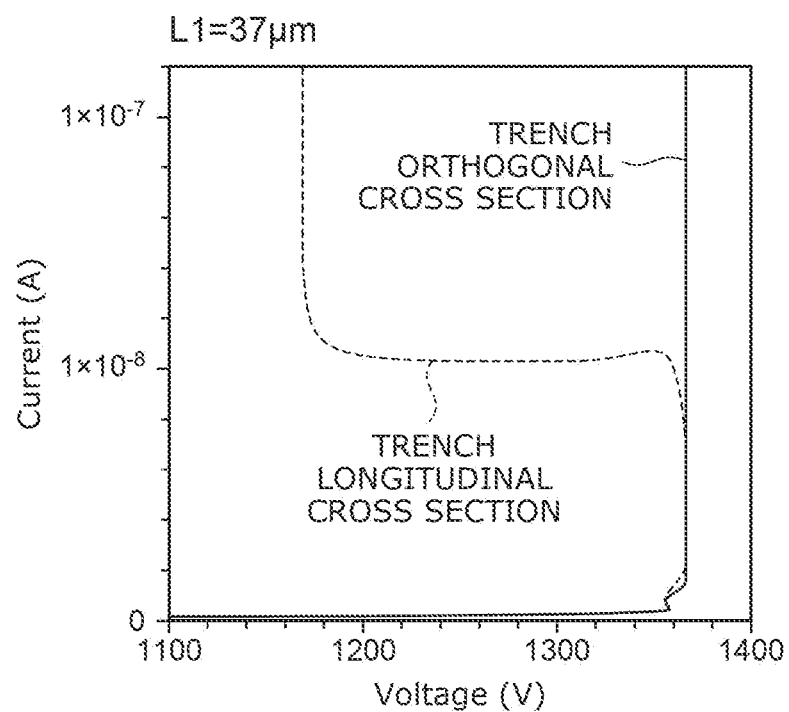

FIGS. 9A and 9B are graphs illustrating simulation results of characteristics of the semiconductor device according to the embodiment.

FIGS. 9A and 9B illustrate the I-V characteristic when a reverse bias is applied to a semiconductor device similar to the semiconductor device 100. Namely, FIGS. 9A and 9B illustrate the relationship between the voltage of the first electrode 11 with respect to the second electrode 12 and the current flowing from the first electrode 11 toward the second electrode 12. In FIG. 9A, the distance L1 shown in FIG. 4 is 17 μm; in FIG. 9B, the distance L1 is 37 μm. In FIGS. 9A and 9B, the impurity amount of the second conductivity type per unit area of the fifth semiconductor region 25 is set to $2\times10^{12}$ atoms/cm$^2$.

FIGS. 9A and 9B each show simulation results for the trench orthogonal cross section and simulation results for the trench longitudinal cross section. The trench orthogonal cross section is a cross section that passes through the multiple trenches T1, is parallel to the second direction D2, and corresponds to the line A-A cross section shown in FIG. 1. The trench longitudinal cross section is a cross section that passes through the trench T1, is parallel to the third direction D3, and corresponds to the line B-B cross section shown in FIG. 1.

In the example of FIG. 9A, the current value abruptly increases when the voltage is at the vicinity of 1370 V. Subsequently, the current value of the trench longitudinal cross section is greater than the current value of the trench orthogonal cross section. It is estimated that this is because the avalanche breakdown occurs more easily at the lower end vicinity of the end portion tg1 of the trench T1 than at the vicinity of the extension part B1 of the fourth semiconductor region 24 (or the extension part B2). It is considered that the current value of the trench longitudinal cross section that includes the end portion tg1 of the trench T1 is therefore relatively large.

On the other hand, in the example of FIG. 9B, the current value abruptly increases when the voltage is at the vicinity of 1365 V. Subsequently, the current value of the trench orthogonal cross section is greater than the current value of the trench longitudinal cross section. It is estimated that this is because avalanche breakdown occurs more easily at the vicinity of the extension part B1 (or the extension part B2) than at the lower end vicinity of the end portion tg1 of the trench T1. It is considered that the current value of the trench orthogonal cross section that includes the extension part B1 is therefore relatively large.

Thus, by reducing the distance L1, avalanche breakdown occurs more easily at the end portion tg1 vicinity of the trench T1.

Figure 10:
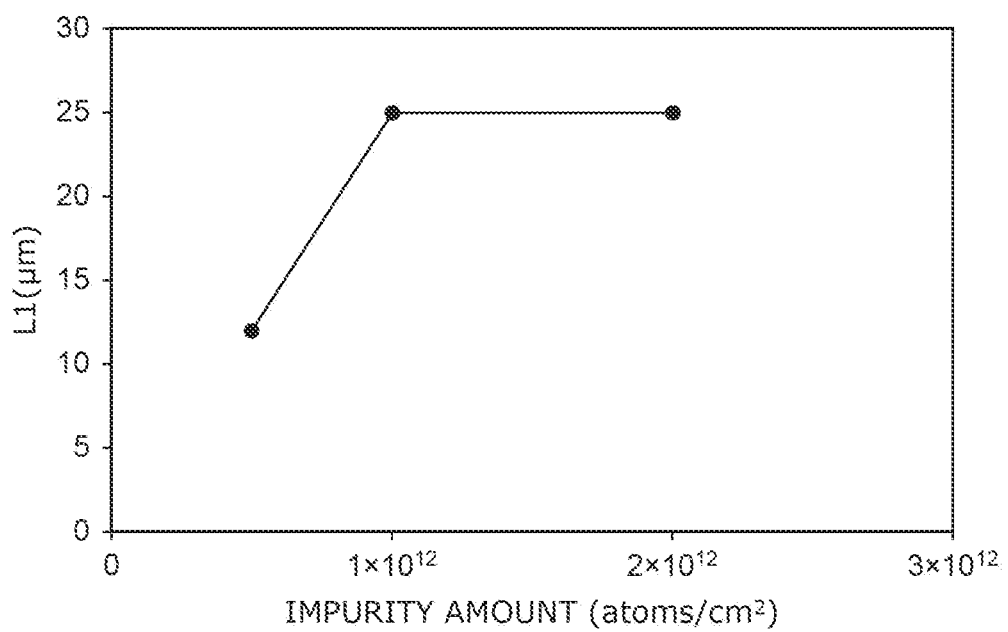
FIG. 10 is a graph illustrating simulation results of a characteristic of the semiconductor device according to the embodiment.

FIG. 10 is a graph illustrating simulation results of a characteristic of the semiconductor device according to the embodiment.

FIG. 10 shows conditions at which avalanche breakdown occurs at the end portion of the trench T1 when a reverse bias is applied to a semiconductor device similar to the semiconductor device 100. The horizontal axis of FIG. 10 is the second-conductivity-type impurity amount (total impurity amount) in atoms/cm$^2$ per unit area of the fifth semiconductor region 25. The vertical axis of FIG. 10 shows the upper limit of the distance L1 at which avalanche breakdown occurs at the end portion of the trench T1 for each impurity amount. That is, the value of the vertical axis of FIG. 10 is the upper limit of the distance L1 at which the magnitude of the current is, for example, greater at the trench longitudinal cross section than at the trench orthogonal cross section.

For example, when the second-conductivity-type impurity amount per unit area of the fifth semiconductor region 25 is $5\times10^{11}$ atoms/cm$^2$, avalanche breakdown occurs at the end portion of the trench T1 when the distance L1 is not more than 12 μm.

For example, when the second-conductivity-type impurity amount per unit area of the fifth semiconductor region 25 is $1\times10^{12}$ atoms/cm$^2$, avalanche breakdown occurs at the end portion of the trench T1 when the distance L1 is not more than 25 μm.

For example, when the second-conductivity-type impurity amount per unit area of the fifth semiconductor region 25 is $2\times10^{12}$ atoms/cm$^2$, avalanche breakdown occurs at the end portion of the trench T1 when the distance L1 is not more than 25 μm.

According to the embodiment, it is favorable for the distance L1 to be, for example, not more than 25 μm. Thereby, avalanche breakdown occurs more easily at the end portion tg1 vicinity of the trench T1. When multiple trenches T1 are included, avalanche breakdown easily occurs at the end portion vicinity of each trench T1. The locations at which avalanche breakdown occurs can be dispersed thereby; and the current concentration can be suppressed. At this time, the second-conductivity-type impurity amount per unit area of the fifth semiconductor region 25 is set to be, for example, not more than $1\times10^{12}$ atoms/cm$^2$.

When the second-conductivity-type impurity amount per unit area of the fifth semiconductor region 25 is $5\times10^{11}$ atoms/cm$^2$, the impurity amount per unit volume of the second conductivity type of the fifth semiconductor region 25 is, for example, $2.5\times10^{15}$ atoms/cm$^3$.

When the second-conductivity-type impurity amount per unit area of the fifth semiconductor region 25 is $1\times10^{12}$ atoms/cm$^2$, the impurity amount per unit volume of the second conductivity type of the fifth semiconductor region 25 is, for example, $5.0\times10^{15}$ atoms/cm$^3$. When the second-conductivity-type impurity amount per unit area of the fifth semiconductor region 25 is $2\times10^{12}$ atoms/cm$^2$, the impurity amount per unit volume of the second conductivity type of the fifth semiconductor region 25 is, for example, $1.0\times10^{16}$ atoms/cm$^3$.

According to embodiments, a semiconductor device can be provided in which the current in the termination region can be suppressed.

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The relative levels of the impurity concentrations between the semiconductor regions can be considered to be equivalent to the relative levels of the carrier concentrations between the semiconductor regions. The impurity concentration in each semiconductor region can be measured by, for example, SIMS (secondary ion mass spectrometry).

In this specification, being "electrically connected" includes not only the case of being connected in direct contact, but also the case of being connected via another conductive member, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
    a first electrode;
    a first semiconductor region located above the first electrode, the first semiconductor region being of a first conductivity type;
    a second semiconductor region located on the first semiconductor region, the second semiconductor region being of a second conductivity type;
    a third semiconductor region located on the second semiconductor region, the third semiconductor region being of the first conductivity type;
    a second electrode located on the second and third semiconductor regions and electrically connected with the second and third semiconductor regions;
    a conductive part including:
        a first conductive region positioned opposite the first to third semiconductor regions via an insulating film, and
        a second conductive region located around the second electrode, electrically connected to the first conductive region;
    a fourth semiconductor region located around the second semiconductor region and electrically connected with the second semiconductor region, the fourth semiconductor region being of the second conductivity type, the fourth semiconductor region including an end portion in a direction perpendicular to a first direction, the first direction perpendicular to a surface of a semiconductor substrate including the first to fourth semiconductor regions, the end portion contacting the first semiconductor region, at least a portion of the end portion being positioned closer to the first electrode side than the second conductive region in the first direction; and
    a fifth semiconductor region located between the second semiconductor region and the fourth semiconductor region, the fifth semiconductor region being of the second conductivity type, the fifth semiconductor region is shallower than the second semiconductor region, the fourth semiconductor region being electrically connected with the second semiconductor region via the fifth semiconductor region.

2. The device according to claim 1,
    wherein
    a resistivity of the fifth semiconductor region being is greater than a resistivity of the fourth semiconductor region.

3. The device according to claim 2, wherein a second-conductivity-type total impurity amount of the fifth semiconductor region is less than a second-conductivity-type total impurity amount of the fourth semiconductor region.

4. The device according to claim 3, wherein the second-conductivity-type total impurity amount of the fifth semiconductor region is not less than $1\times10^{12}$ atoms/cm$^2$.

5. The device according to claim 1, wherein the insulating film and the first conductive region are located inside a trench provided on the first semiconductor region.

6. The device according to claim 5, wherein a distance between the end portion of the fourth semiconductor region and an end portion in an extension direction of the trench is not more than 25 μm.

7. The device according to claim 5, wherein the trench is deeper than the fourth semiconductor region.

8. The device according to claim 5, wherein
    a plurality of the trenches is included,
    the plurality of trenches is arranged in a second direction perpendicular to the extension direction, the second electrode includes a contact contacting the second semiconductor region,
    the fourth semiconductor region includes an extension part arranged with the contact in the second direction on the surface, and
    the contact is not located between the extension part and a trench among the plurality of trenches most proximate to the extension part on the surface.

9. The device according to claim 1, further comprising:
    a sixth semiconductor region surrounding the fourth semiconductor region,
    the sixth semiconductor region being of the second conductivity type, a second-conductivity-type total impurity amount of the fourth semiconductor region being less than a second-conductivity-type total impurity amount of the sixth semiconductor region.

10. A semiconductor device, comprising:
a first electrode;
a first semiconductor region located above the first electrode, the first semiconductor region being of a first conductivity type;
a second semiconductor region located on the first semiconductor region, the second semiconductor region being of a second conductivity type;
a third semiconductor region located on the second semiconductor region, the third semiconductor region being of the first conductivity type;
a second electrode located on the second and third semiconductor regions and electrically connected with the second and third semiconductor regions;
a conductive part including
    a first conductive region positioned opposite the first to third semiconductor regions via an insulating film, and
    a second conductive region located around the second electrode, electrically connected to the first conductive region;
a fourth semiconductor region located around the second semiconductor region and electrically connected with the second semiconductor region, the fourth semiconductor region being of the second conductivity type, the fourth semiconductor region including an end portion in a direction perpendicular to a first direction, the first direction perpendicular to a surface of a semiconductor substrate including the first to fourth semiconductor regions, the end portion contacting the first semiconductor region, at least a portion of the end portion is below the second conductive region and overlaps the second conductive region in the first direction; and
a fifth semiconductor region located between the second semiconductor region and the fourth semiconductor region, the fifth semiconductor region being of the second conductivity type, a difference in depth between the second semiconductor region and the fourth semiconductor region is smaller than a difference in depth between the second semiconductor region and the fifth semiconductor region, the fourth semiconductor region being electrically connected with the second semiconductor region via the fifth semiconductor region.

11. The device according to claim 10, wherein
a resistivity of the fifth semiconductor region being is greater than a resistivity of the fourth semiconductor region.

12. The device according to claim 11, wherein a second-conductivity-type total impurity amount of the fifth semiconductor region is less than a second-conductivity-type total impurity amount of the fourth semiconductor region.

13. The device according to claim 12, wherein the second-conductivity-type total impurity amount of the fifth semiconductor region is not less than $1 \times 10^{12}$ atoms/cm$^2$.

14. The device according to claim 10, wherein the insulating film and the first conductive region are located inside a trench provided on the first semiconductor region.

15. The device according to claim 14, wherein a distance between the end portion of the fourth semiconductor region and an end portion in an extension direction of the trench is not more than 25 μm.

16. The device according to claim 14, wherein the trench is deeper than the fourth semiconductor region.

17. The device according to claim 14, wherein
a plurality of the trenches is included,
the plurality of trenches is arranged in a second direction perpendicular to the extension direction, the second electrode includes a contact contacting the second semiconductor region,
the fourth semiconductor region includes an extension part arranged with the contact in the second direction on the surface, and
the contact is not located between the extension part and a trench among the plurality of trenches most proximate to the extension part on the surface.

18. The device according to claim 10, further comprising:
a sixth semiconductor region surrounding the fourth semiconductor region,
the sixth semiconductor region being of the second conductivity type,
a second-conductivity-type total impurity amount of the fourth semiconductor region being less than a second-conductivity-type total impurity amount of the sixth semiconductor region.

19. The device according to claim 1, wherein the depth of the fourth semiconductor region is equal to the depth of the second semiconductor region.

20. The device according to claim 10, wherein the depth of the fourth semiconductor region is equal to the depth of the second semiconductor region.

* * * * *